United States Patent [19]

Gifford et al.

[11] Patent Number: 5,378,312
[45] Date of Patent: Jan. 3, 1995

[54] PROCESS FOR FABRICATING A SEMICONDUCTOR STRUCTURE HAVING SIDEWALLS

[75] Inventors: George G. Gifford, Poughkeepsie; Yeong-Jyh T. Lii, Peekskill; Jin J. Wu, Ossining, all of N.Y.

[73] Assignee: International Business Machines Corporation, Armonk, N.Y.

[21] Appl. No.: 164,223

[22] Filed: Dec. 7, 1993

[51] Int. Cl.⁶ .................................. H01L 21/00
[52] U.S. Cl. ................... 156/643; 156/646; 156/655; 134/7; 437/225
[58] Field of Search ............. 156/643, 646, 625, 640, 156/655; 204/192.35, 192.37; 134/7; 437/225, 228

[56] References Cited

U.S. PATENT DOCUMENTS

| | | | |
|---|---|---|---|
| 4,617,064 | 10/1986 | Moore | 134/7 |
| 4,631,250 | 12/1986 | Hayashi | 430/329 |
| 4,806,171 | 2/1989 | Whitlock et al. | 134/7 |
| 4,985,113 | 1/1991 | Fujimoto et al. | 156/643 |
| 5,025,632 | 6/1991 | Spritzer | 62/64 |
| 5,035,750 | 7/1991 | Tada et al. | 134/7 |
| 5,062,898 | 11/1991 | McDermott et al. | 134/7 |
| 5,125,979 | 6/1992 | Swain et al. | 134/7 |
| 5,147,466 | 9/1992 | Ohmori et al. | 134/7 |
| 5,209,028 | 5/1993 | McDermott et al. | 134/7 X |
| 5,228,950 | 7/1993 | Webb et al. | 156/643 |
| 5,294,261 | 3/1994 | McDermott et al. | 134/7 |
| 5,310,456 | 5/1994 | Kadomura | 156/643 X |

*Primary Examiner*—Thi Dang
*Attorney, Agent, or Firm*—Richard Lau

[57] ABSTRACT

A method of fabricating a semiconductor structure includes the steps of providing a semiconductor substrate having a material disposed thereon, masking the material with a mask having an appropriate pattern for forming a semiconductor structure, etching unmasked portions of the material so as to form the semiconductor structure, wherein the etching produces a film which attaches onto the semiconductor structure and/or on the semiconductor substrate, and removing the film from the semiconductor structure according to the steps of producing a cryogenic jet stream having cryogenic particles therein, and directing the cryogenic jet stream at the film such that the crogenic jet stream impinges on and causes the film to decrease in temperature so that a high temperature gradient develops between the film and the semiconductor structure, the film detaching from the semiconductor structure and fracturing due to contraction caused by the decrease in temperature and high temperature gradient.

17 Claims, 7 Drawing Sheets

PROCESS FOR FABRICATING A SEMICONDUCTOR STRUCTURE HAVING SIDEWALLS

RELATED U.S. PATENT APPLICATIONS

This patent application is related to the following commonly assigned, co-pending, patent applications:
U.S. Ser. No. 08/076,052, Docket No. FI9-93-041
U.S. Ser. No. 08/076,051, Docket No. FI9-93-031
U.S. Ser. No. 08/076,065, Docket No. FI9-93-033
U.S. Ser. No. 08/076,053, Docket No. FI9-93-032

TECHNICAL FIELD

The present invention relates generally to processes for fabrication of semiconductor structures and, more particularly, to such a process which uses a cryogenic jet stream for removal of certain material.

BACKGROUND OF THE INVENTION

Dry etching techniques, such as reactive ion etching, have become indispensable as fine pattern delineation techniques in very large scale integration (VLSI) fabrication. As a specific example, reactive ion etching involves ion bombardment of the surface being etched. As pattern densities increase and device dimensions shrink, it is important to tightly control the degree of isotropy or undercutting of etching profiles. During the etching of silicon, oxide or metal, gases which react in plasma such as chlorine, bromine or iodine containing gases, are typically used to generate low volatility etch products which deposit as passivating films on sidewalls in order to achieve anisotropic etch profiles. In addition, etch by-products also deposit onto the substrate and can terminate the etching when certain underlying materials are reached during the etching process.

As a specific example, fluorocarbon compounds are often used to etch insulator materials, such as silicon dioxide or silicon nitride. Carbon-polymers are deposited on the sidewalls of the etched region, and are also deposited when the etching proceeds to the underlying layer material. The underlying layer material may comprise, for example, silicon, silicide, or metals. Carbon-polymers deposit on these materials because the interaction of the fluorocarbon radicals with these materials produces fewer volatile by-products. This is also the case for sidewalls because ion bombardment less effectively initiates etching on these sloped surfaces. In both cases, the carbon-polymers inhibit continued etching.

The sidewall films and etch by-products allow reactive ion etching to be highly selective and to produce substantially anisotropic profiles. These sidewall films containing C, O, H, Cl, metals or other species are relatively thick, chemically resistant, and less exposed to ion bombardment during the etching. These films are also produced during plasma etching where substantially less ion bombardment is involved. In both types of etching, before subsequent processing can continue, these sidewall films and etch by-products must be removed. In some cases, such as in metal etching, the sidewall films contain chlorine compounds which cause the fine structure to corrode if they are not removed within a few hours. The sidewall films and etch by-products contain impurities which can adversely affect the success of subsequent processing and ultimately the electrical performance of the resulting devices.

Currently, the most widely implemented post-plasma-etch cleaning processes utilize RCA cleaning, chemical vapors and/or wet chemical etching, utilizing acids, such as dilute HF, $H_2SO_4/H_2O_2$, and chromic acid. Disadvantageously, these techniques result in etching of thin surface films including silicon dioxide, silicide, metal, and cause undercut and lift-off of thin films. Degradation of the thin films becomes unacceptable as device dimensions continue to shrink. In addition, the wet chemical clean methods are unable to produce a substantially particle and residue free surface, which is critical for high yield device manufacturing.

U.S. Pat. No. 5,025,632 to Spritzer relates to a method and apparatus for removing a surface layer of energetic material, such as solid rocket propellants, explosives and pyrotechnic materials, contained within munition casings. Spritzer discloses utilizing a wand to direct a cryogenic fluid spray at the material in a dry washout process to freeze and embrittle the surface layer either by precooling and fluid spray, or by spray alone. However, the Spritzer method does not relate to and is incapable of removing sidewall films and etch by-products from delicate, fragile, and tightly spaced semiconductor structures.

SUMMARY OF THE INVENTION

The present invention relates generally to a method of fabricating a semiconductor structure. A semiconductor substrate having a material disposed thereon is provided. The material is masked with a mask having an appropriate pattern for forming a semiconductor structure. Unmasked portions of the material are etched so as to form the semiconductor structure. The etching produces a film which attaches onto the semiconductor structure and/or on the semiconductor substrate. The film is removed from the semiconductor structure by producing a cryogenic jet stream having cryogenic particles therein, and directing the cryogenic jet stream at the film such that the crogenic jet stream impinges on and causes the film to decrease in temperature so that a high temperature gradient develops between the film and the semiconductor structure, and the film detaches from the semiconductor structure and fractures due to contraction caused by the decrease in temperature and high temperature gradient.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENTS

Figure 1A:
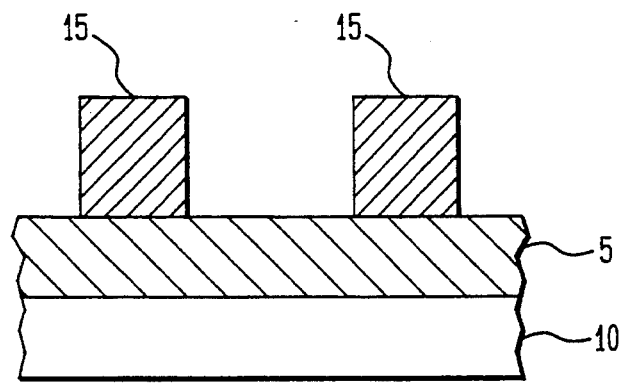
FIGS. 1A–C show successive process steps for fabricating a semiconductor structure in accordance with the present invention, and includes a step of removing the mask.
Figure 1B:
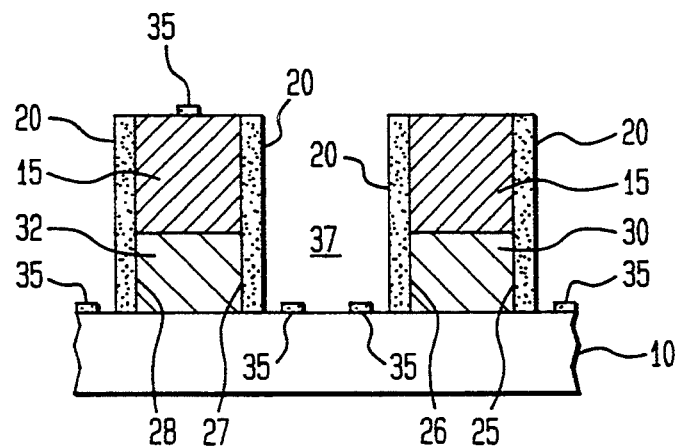
Figure 1C:
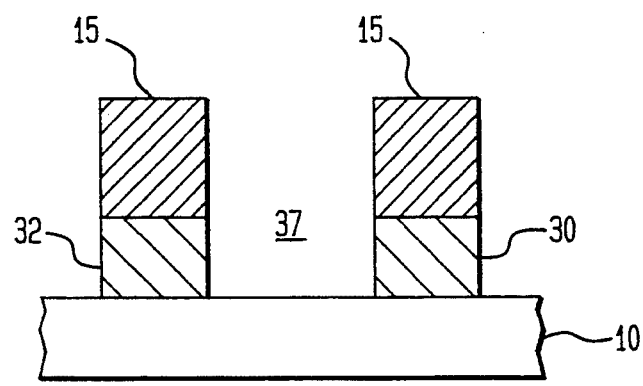

Referring initially to FIGS. 1A–C, process steps are shown for fabricating a semiconductor structure in accordance with the present invention. As shown in FIG. 1A, material 5 to be etched is disposed on a substrate 10. The material 5 to be etched can comprise any material as required for fabricating a semiconductor structure, such as silicon, oxide, metal, etc., and can be deposited or grown on the substrate 10 by conventional techniques. A mask 15 is produced, also by conventional techniques, such as by lithographic patterning, on the material 5 to be etched. In order to allow for fabrication of the semiconductor structure, the material 5 should be capable of being selectively etched relative to the mask 15. For example, depending on the material 5 to be etched, the mask 15 can comprise photoresist, oxide, nitride, or the like.

The material 5 is then etched by conventional techniques of dry etching, such as plasma etching, reactive ion etching, or sputter etching, to produce one or more semiconductor structures 30, 32 as shown in FIG. 1B. Reactive ion etching is used as a specific example. Generally, reactive ion etching involves a combination of physical and chemical etching and utilizes reactive ionized gas to remove the portions of the material 5 that are not protected by a mask 15. In order to achieve the required anisotropy, appropriate gas(es), such as chlorine, bromine or iodine containing gases, are introduced during reactive ion etching to produce low volatility etch products which deposit as continuous films 20 on the sidewalls of the mask 15, and on the sidewalls 25–28 of the semiconductor structures 30, 32. These sidewall films 20 serve to passivate the sidewalls 25–28 of the semiconductor structures 30, 32 for achieving anisotropic etch profiles by preventing deterioration or undercutting of the semiconductor structures 30, 32 which could result from etching. In more detail, as the reactive ion etching proceeds with the gas(es) introduced therewith, the sidewall films 20 first form on the exposed sidewalls of the mask 15, and then on the sidewalls of the material 5 as the sidewalls of the material 5 become further exposed from the etching. Subsequent to the etching, the sidewall films 20 must be removed. The removal mechanism in accordance with the present invention is explained in detail below.

In accordance with the pattern of the mask 15, fabrication of the semiconductor structures 30, 32 oftentimes results in formation of a recessed or depressed area, such as a trench 37, between the semiconductor structures 30, 32. The sidewall films 20 are bonded or attached to the opposing sidewalls 26 and 27 of the semiconductor structures 30, 32 which define the boundaries of the trench 37. As technology progresses and device dimensions continue to decrease, the dimensions of these trenches also continue to decrease. For example, in state-of-the-art CMOS technology, trench width dimensions are on the order of sub-0.5 micron and, in order to adequately remove the sidewall films 20, the removal mechanism must allow for accessing the sidewalls which form the trenches.

As shown in FIG. 1B, the sidewall films 20 generated during etching allows for the production of a substantially anisotropic etch profile due to the minimized lateral etching of the material by free radicals and ion bombardment induced etching.

In some situations, the etch by-products are caused to deposit onto the substrate 10 as etch stop films 35. These etch stop films 35 indicate during etching that the substrate 10 has been reached and thus etching should be terminated. These etch stop films 35 cause the etch rate selectivity between the material 5 and the substrate 10. The etch stop films 35 may also be created on top of the mask 15, as shown FIG. 1B. As in the case of the sidewall films 20, these etch stop films 35 must also be removed subsequent to the etching.

Heat conductance is generally poor between the sidewall films 20 and the sidewalls 25–28, and between the etch stop films 35 and the substrate 10 or mask 15. This is due to the sidewall films 20 and etch stop films 35 comprising material having significantly different thermal conductivity properties as compared to the semiconductor structures 30, 32. As a specific example, the thermal conductivity of a sidewall film comprising organic material, such as a polymer, is on the order of 0.001 watt/cm-K., and the thermal conductivity of a semiconductor structure comprising, for instance, silicon is on the order of 0.01–1 watt/cm-K., and the thermal conductivity of a metal is on the order of 1–100 watt/cm-K. Thus, it can be appreciated that the magnitude of difference in thermal conductivity between the sidewall film and a semiconductor structure is on the order of 10–1,000 times; and the magnitude of difference in thermal conductivity between the sidewall film and metals is on the order of 1,000–10,000 times. Further, the sidewall films 20 and etch stop films 35 attach relatively loosely to the semiconductor structures 30, 32, mask 15 and substrate 10, which also causes the heat conductance to be poor. The mechanism by which the sidewall films 20 and etch stop films 35 attach is explained below.

Generally, the sidewall films 20 and etch stop films 35 are attached or bonded to the the sidewalls and substrate by forms of chemisorption and physisorption, depending on the nature of the etch and the by-products that are created. In other words, the films have minor intermixing with the sidewalls and substrate and in this way become either chemisorbed or physisorbed therewith. Further, the films can be crosslinked due to the plasma, thus creating radicals and dangling bonds. These radicals and dangling bonds increase the self-cohesiveness of the films. For instance, selective oxide etching over silicon typically creates fluorocarbon residues that line the inner areas of the etched region. These residues may include inorganic material, such as silicon and metals, if the bottom of the etched regions contain such inorganic material. The presence of these inorganic material can affect the physical and chemical properties of the by-products and influence the strength of the bond of the by-products to the sidewalls and substrate.

If the mask 15 will be required during subsequent processing, then the sidewall films 20 and etch stop films 35 are removed without stripping the mask 15. The resulting structures 40, 42 are shown in FIG. 1C.

Figure 2A:
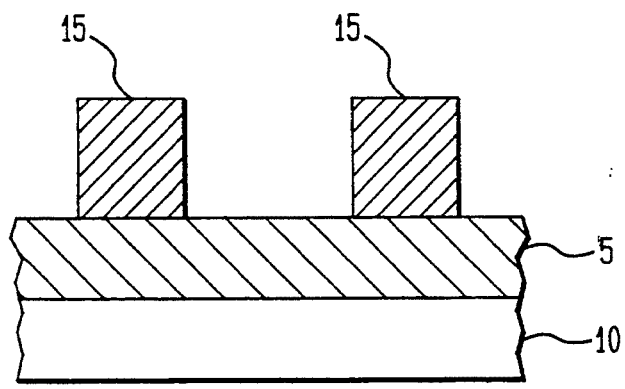
FIGS. 2A–D show successive process steps for fabricating a semiconductor structure in accordance with the present invention, and excludes a step of removing the mask.
Figure 2B:
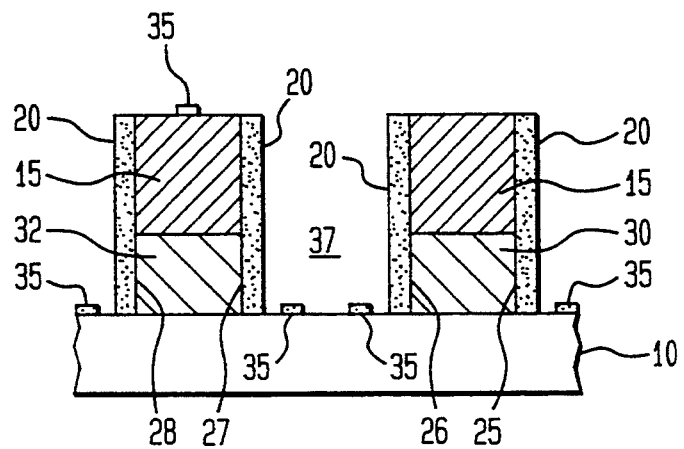
Figure 2C:
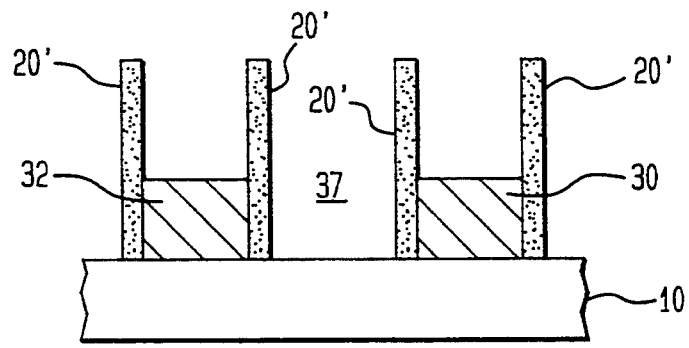
Figure 2D:
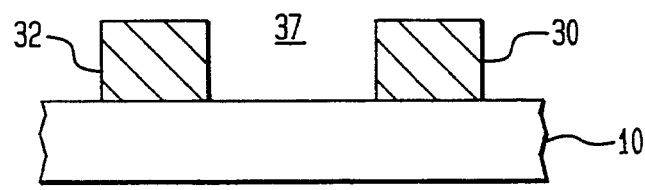

Reference is now made to FIGS. 2A–D. Note that the processing steps shown in FIGS. 2A–B are the same as those shown in FIGS. 1A-B. As shown in FIG. 2C, if the mask 15 is not required during subsequent processing, then the mask 15 is stripped from the material 5, and the portions of the sidewall film 20 that were attached to the mask 15 now remain as a type of film referred to herein as a fence 20'. The fences 20' and remaining portions of sidewall film 20 are then removed, with the resulting structures 45,47 shown in FIG. 2D.

Removal of the sidewall films 20 and fences 20', and etch stop films 35 is explained in greater detail hereinbelow.

Figure 3A:
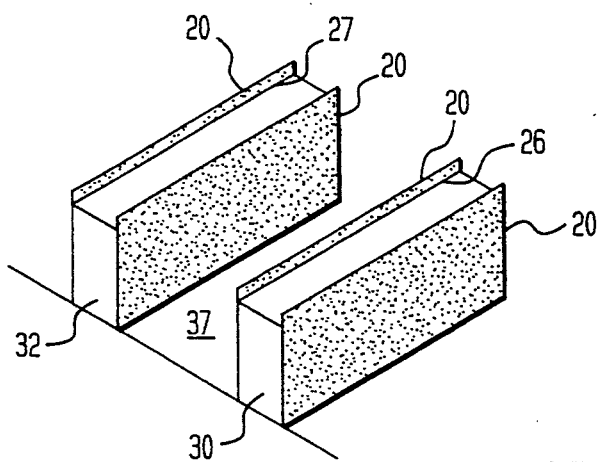
FIGS. 3A–C illustrate removal of sidewall films from the semiconductor structures of FIG. 1 and FIG. 2 in accordance with the present invention.
Figure 3B:
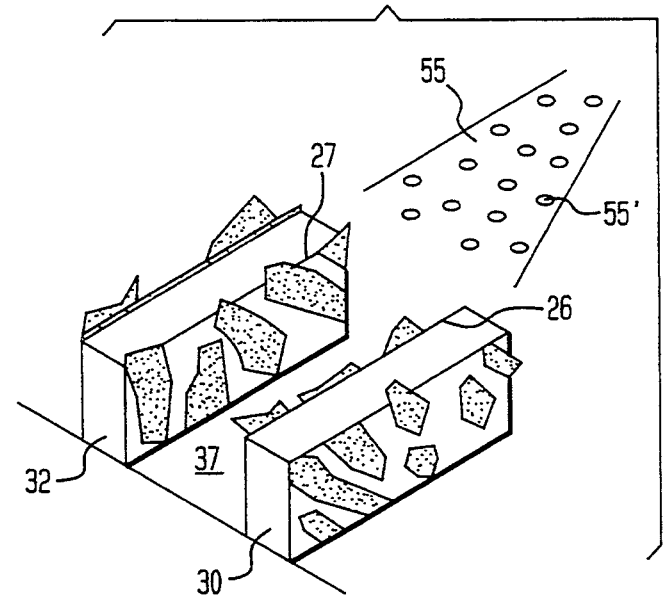
Figure 3C:
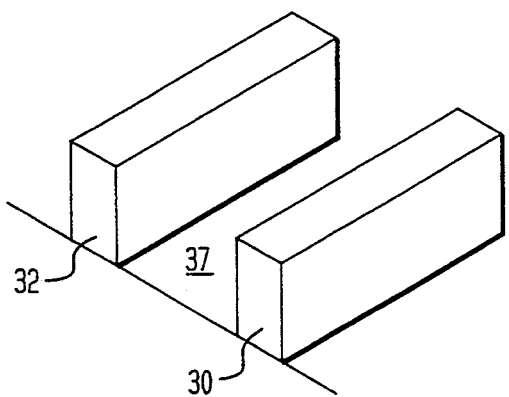

Reference is now made to FIGS. 3A-C, which illustrate removal of the sidewall films 20, etch stop films 35, and fences 20' shown in FIG. 1 and FIG. 2. Note that the removal mechanism is the same for the sidewall films 20, etch stop films 35 and fences 20', and thus the removal mechanism shall be described with reference to removal of the sidewall film 20 from the trench 37, and it should be understood that this removal mechanism is the same for the etch stop films 35, fences 20', and any other situation as may be contemplated by those skilled in the art in which a film or similar substance is attached to a semiconductor structure or component and required to be removed therefrom. Further, it should also be noted that the removal mechanism according to the invention will be the same whether the mask 15 is stripped before or after removal of the sidewall film 20 therefrom.

As shown, the sidewall films 20 is removed using a cryogenic gas jet stream or cryogenic aerosol 55 which carries cryogenic particles 55' therein. More specifically, the crogenic jet stream 55 is directed at the sidewall films 20 such that the cryogenic jet stream 55 impinges on and causes the sidewall films 20 to rapidly decrease in temperature and essentially freeze. Since heat conductivity between the sidewall films 20 and the semiconductor structures 30,32 is poor, impingement of the cryogenic jet stream 55 upon the sidewall films 20 causes a high temperature gradient to develop between the sidewall films 20 and the sidewalls 25-28 of the semiconductor structures 30,32. The thermal stress caused by the rapid decrease in temperature and the high temperature gradient cause the sidewall films 20 to contract, and eventually fracture. Such fracturing results in detachment of the sidewall films 20 from the sidewalls 25-28 of the semiconductor structures 30,32.

In order for the cryogenic jet stream 55 to effectively remove the sidewall films 20 from the sidewalls 26,27 of the semiconductor structures 30,32 which define the boundaries of trench 37, or any other such depressed or recessed area, while at the same time avoiding damaging the semiconductor structures 30,32 during such removal, the physical properties of the cryogenic jet stream 55, and the cryogenic particles 55' being carried therein, must be controlled. In particular, control must be maintained over the direction of the cryogenic jet stream 55, the velocity of the cryogenic particles 55', and the size or diameter of the cryogenic particles 55'.

Figure 4:
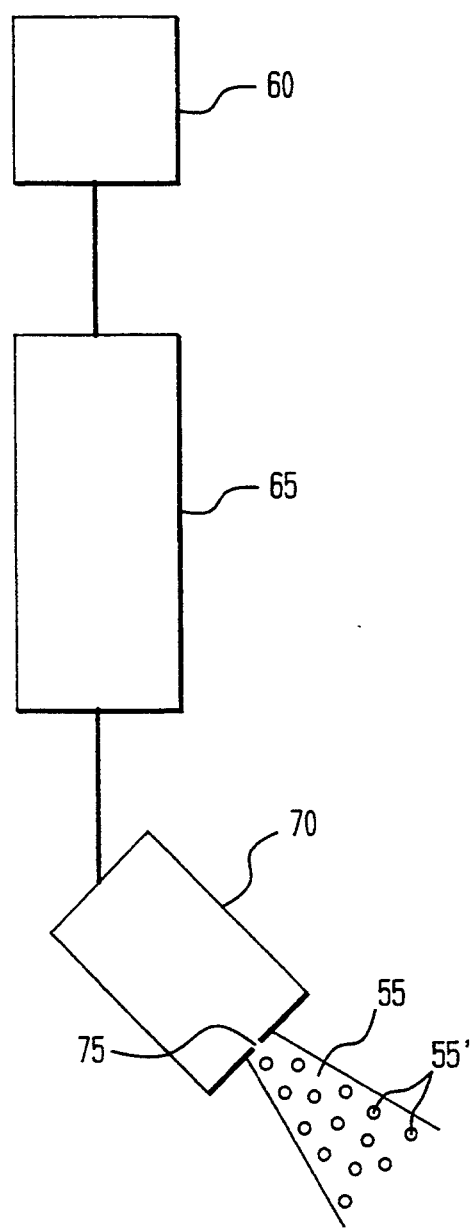
FIG. 4 shows an overall schematic illustration of an apparatus for producing a cryogenic jet stream in accordance with the present invention.

With reference now to FIG. 4, as described in the above-mentioned, commonly assigned, co-pending U.S. Patent Applications, which are incorporated herein by reference, the cryogenic jet stream 55 having cryogenic particles 55' therein can be formed during the expansion of a vapor liquid mixture. More specifically, in order to effectuate removal of the sidewall film 20 as described above, an apparatus capable of producing a cryogenic aerosol includes a source 60 of highly pure gas, such as carbon dioxide, argon, or nitrogen gas. The gas is fed from the source 60 to a heat exchanger 65. The heat exchanger 65 cools the gas to near its liquefaction or solidification point, i.e., within about 5-20 degrees F. above its gas to liquid and/or solid transition temperature, however, maintaining the majority of the gas in a gaseous state through the heat exchanger 65, thus forming a vapor liquid mixture. The vapor liquid mixture from the heat exchanger 65 is fed to a nozzle 70, wherein the vapor liquid mixture is adiabatically expanded through an orifice 75 of the nozzle 70 to a lower pressure so that at least a substantial portion of the vapor liquid mixture solidifies, and is directed at the film to be removed, such as the sidewall film 20. The pressure in which the vapor liquid mixture expands may range from high vacuum to greater than atmospheric pressure. This expansion effectuates Joule-Thompson cooling of the vapor liquid mixture so as to cause the vapor liquid mixture to nucleate and condense into the cryogenic solid particles 55'.

As mentioned above, one factor to consider is the direction at which the cryogenic jet stream 55 is aimed. The direction of the cryogenic jet stream 55 should allow for the majority of cryogenic particles 55' to penetrate into the trench 37. The specific required direction of the cryogenic jet sream 55 which will allow for adequate penetration depends on the degree of depression or recession of the trench 37. However it has been found that directing the cryogenic jet stream 55 at an angle of between approximately 20 degrees and approximately 90 degree relative to the substrate 10 provides adequate penetration into the depressed areas in most situations.

Another factor to consider is the velocity of the cryogenic particles 55' within the cryogenic jet stream 55. In this regard, the cryogenic particles 55' should possess sufficient velocity to penetrate through any stagnant gas (or fluid) boundary layer that may exist on the semiconductor structures 30,32 as a result of the etching process, and to penetrate into the trench 37. Adequate velocity of the cryogenic particles 55' is also important because the cryogenic particles 55' function to sputter or carry away fractured sidewall film 20 after detachment from the semiconductor structures 30,32. However, the velocity of the cryogenic particles 55' should not be overly excessive. Impact by cryogenic particles 55' which possess excessivly high velocity may cause damage to the semiconductor structures 30,32 and/or substrate 10. Specifically, in the case of reactive ion etching, in order to reduce the possibility of pattern or structure damage, the mechanical energy produced by a single cryogenic particle 55' should be controlled so as to be below the bombardment energies of the plasma ions used during the etching. For example, bombardment energies of plasma ions are typically on the order of 10 to 100 eV, concentrating into a molecule that is on the order of 10-20 Angstrom in size. Thus, it is preferable that each cryogenic particle 55' has a velocity which allows the cryogenic particle 55' to impact the sidewall films 20 and substrate 10 with mechanical energy of below approximately 100 eV. However, the velocity of the cryogenic particles 55' cannot be excessively lowered. In this regard, the vapor liquid mixture must be adequately expanded through the orifice 75 in order to form the cryogenic particles 55', and the pressure of this expansion is a controlling factor of the velocity of the cryogenic particles 55'. Thus, the cryogenic particles 55' will have a minimum velocity as dictated by the pressure of the expansion required for its production. It has been found that the cryogenic particles 55' have a velocity of near sonic velocity when properly formed. The force at which the cryogenic particles 55' impact the sidewall films 20 and substrate 10 is controlled by velocity, as well as its size; controlling of the size of the cryogenic particles 55' is explained in detail below.

The size of the cryogenic particles 55' within the cryogenic jet stream 55 must be controlled so as to allow penetration of the cryogenic particles 55' into the trench 37 for enabling impingement of the cryogenic particles 55' upon the sidewall films 20 existing on the sidewalls 26,27 of the semiconductor structures 30,32. A sufficient number of cryogenic particles 55' must penetrate and impinge upon these sidewall films 20 so that the temperature of these sidewall films 20 will be adequately lowered for removal thereof from the semiconductor structures 30,32; and a sufficient number of cryogenic particles 55' is required to effectively sputter or carry away the sidewall films 20 after the sidewall films 20 are fractured and removed. The size of the cryogenic particles 20 should also be controlled because if the cryogenic particles 20 are allowed to become too large, impact by the cryogenic particles 20 may cause damage to the semiconductor structures 30,32 during removal of the sidewall films 20 therefrom.

Size of the cryogenic particles 55' is discussed herein in terms of its mean size and, more specifically, in terms of the diameter of the cryogenic particles 55'. The diameter of the cryogenic particles 55', carrying sonic velocity, is preferred to be less than approximately 1 micron.

The temperature reduction caused by the expansion of the vapor liquid mixture through the orifice 75 allows the condensible vapor species within the vapor liquid mixture to form clusters through collisions between molecules. The minimum stable size of the nuclei of the clusters, which are precursors of the cryogenic particles 55;, formed during this process is given by the following:

$$a = 2\sigma v_1 / kT \ln S$$

where "$\sigma$" is the surface tension, "$v_1$" is the molecular volume of the nucleating species, "$k$" is the Boltzmann constant, "$T$" is the temperature of the gas stream after expansion through the orifice 75 in which the nucleation occurs, and "$S$" is the saturation ratio of the condensible species attained during the expansion and cooling. A rapid expansion through the orifice 75 produces a significant temperature drop in the vapor liquid mixture, and thus allows the condensible vapor species to reach saturation. The higher the attained saturation ratio S, the smaller the nuclei can be and remain stable for further growth. Rapid growth to enhance the size of the cryogenic particles 55' from the diffusion of vapor molecules onto the nuclei occurs simultaneously.

The nuclei grow into particles by scavenging the vapor molecules. The rate of growth is determined by the collision with vapor molecules and is given by equation (1) as follows:

$$R_k = (\pi/4) d_p^2 \overline{C}_1 N_{sat}(S-1) \tag{1}$$

where "$d_p$" is the particle diameter size, "$\overline{c}_1$" is the mean vapor molecular speed, "$N_{sat}$" is the vapor concentration at saturation. The rate of growth of the cryogenic particles 55' is limited by the diffusion of vapor molecules onto the cryogenic particles 55' once the size of the cryogenic particles 55' is much larger than the mean free path of the vapor molecules, and is then given by equation (2) as follows:

$$R_c = 2\pi d_p D_1 N_{sat}(S-1) \tag{2}$$

where "$D_1$" is the vapor molecular diffusivity. The cryogenic particles 55' will gradually vaporize and/or shrink in size if the environmental temperature and/or concentration of the vapor molecules do not thermodynamically favor the existence of the material in the condensed phase.

An accurate estimate of the size of the cryogenic particles 55' for controlling the size thereof requires the prediction of the saturation ratio S after the expansion. The mass of the vapor liquid mixture determines the concentration of the condensible species after the expansion. The material discharged through the orifice 75, which can also be defined as a restricted opening, during the expansion is proportional to the area of the orifice 75 opening and the pressure of the flow prior to the expansion; and inversely proportional to the square root of the temperature of the vapor liquid mixture prior to the expansion. The pressure and the temperature of a material to allow it to remain as a vapor liquid mixture are related.

Thus, as can be appreciated from equations (1) and (2), it can be concluded that the factors which control the size of the cryogenic particles are the pressure of expansion of the vapor liquid mixture, the temperature of the vapor liquid mixture, and the size of the orifice opening. As such, in order to control the size of the cryogenic particles, these factors must be controlled.

Figure 5A:
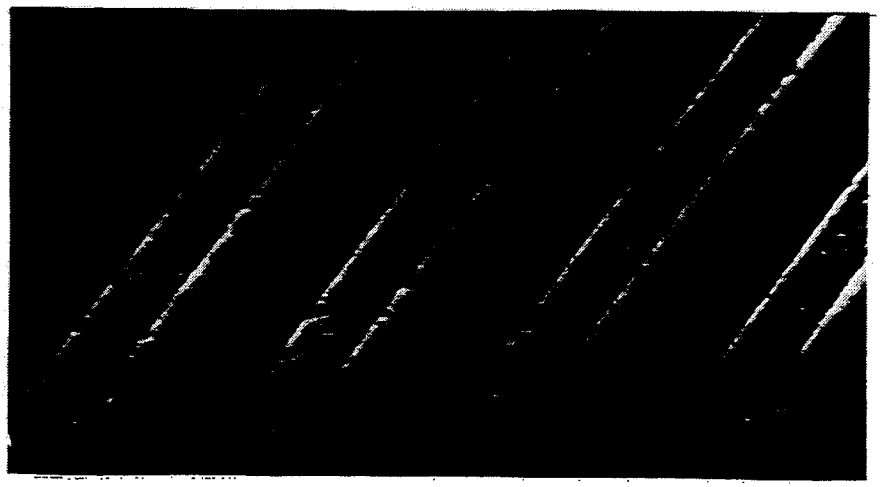
FIG. 5A is a micrograph showing semiconductor structures having sidewall film attached thereon.
Figure 5B:
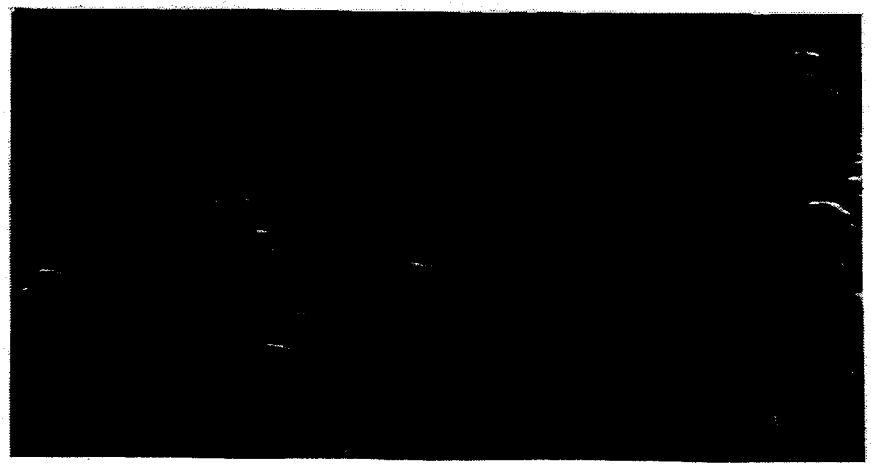
FIG. 5B is a micrograph showing the semiconductor structures of FIG. 5A with the sidewall film removed therefrom in accordance with the present invention, without damaging the semiconductor structures.

As a specific example, a cryogenic jet stream, having cryogenic nitrogen particles therein which are submicron in size, can be produced by expanding nitrogen vapor liquid mixture of approximately 75 psia and approximately −290 F. into the atmosphere through an orifice having a diameter of between approximately 0.005" and 0.05". With reference to FIG. 5A, sidewall film is shown attached to semiconductor structures resulting from a conventional metal etch process. A nitrogen jet stream produced as outlined above was able to remove the sidewall film from the semiconductor structures without damaging the semiconductor structures, and the result is shown in FIG. 5B. The semiconductor structure will not be damaged when the sidewall film is removed therefrom using a cryogenic jet stream produced by expanding a nitrogen vapor liquid mixture through an orifice having a diameter of between 0.005" and 0.05" into vacuum, wherein the nitrogen vapor liquid mixture has a pressure of between approximately 11 psia and approximately 150 psia, and a temperature of between approximately −341 F. and −270 F.

Figure 5C:
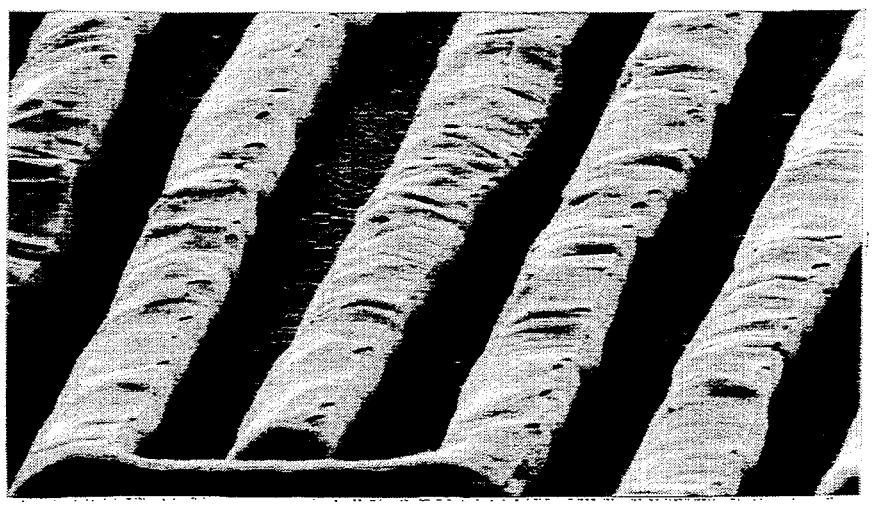
FIG. 5C is a micrograph showing the semiconductor structures of FIG. 5A with the sidewall film removed therefrom, but with damage to the semiconductor structures.

In another specific example, a cryogenic jet stream, having cryogenic nitrogen particles therein which are supermicron in size, can be produced by expanding a nitrogen vapor liquid mixture of approximately 165 psia and approximately −265 F. into vacuum through an orifice having a diameter of approximately 0.1". The resulting cryogenic jet stream generated mechanical power which was significantly higher than that of the above-described cryogenic jet stream and when directed at the semiconductor structures shown in FIG. 5A, caused severe damage to the semiconductor structures, the results being shown in FIG. 5C.

Figure 6:
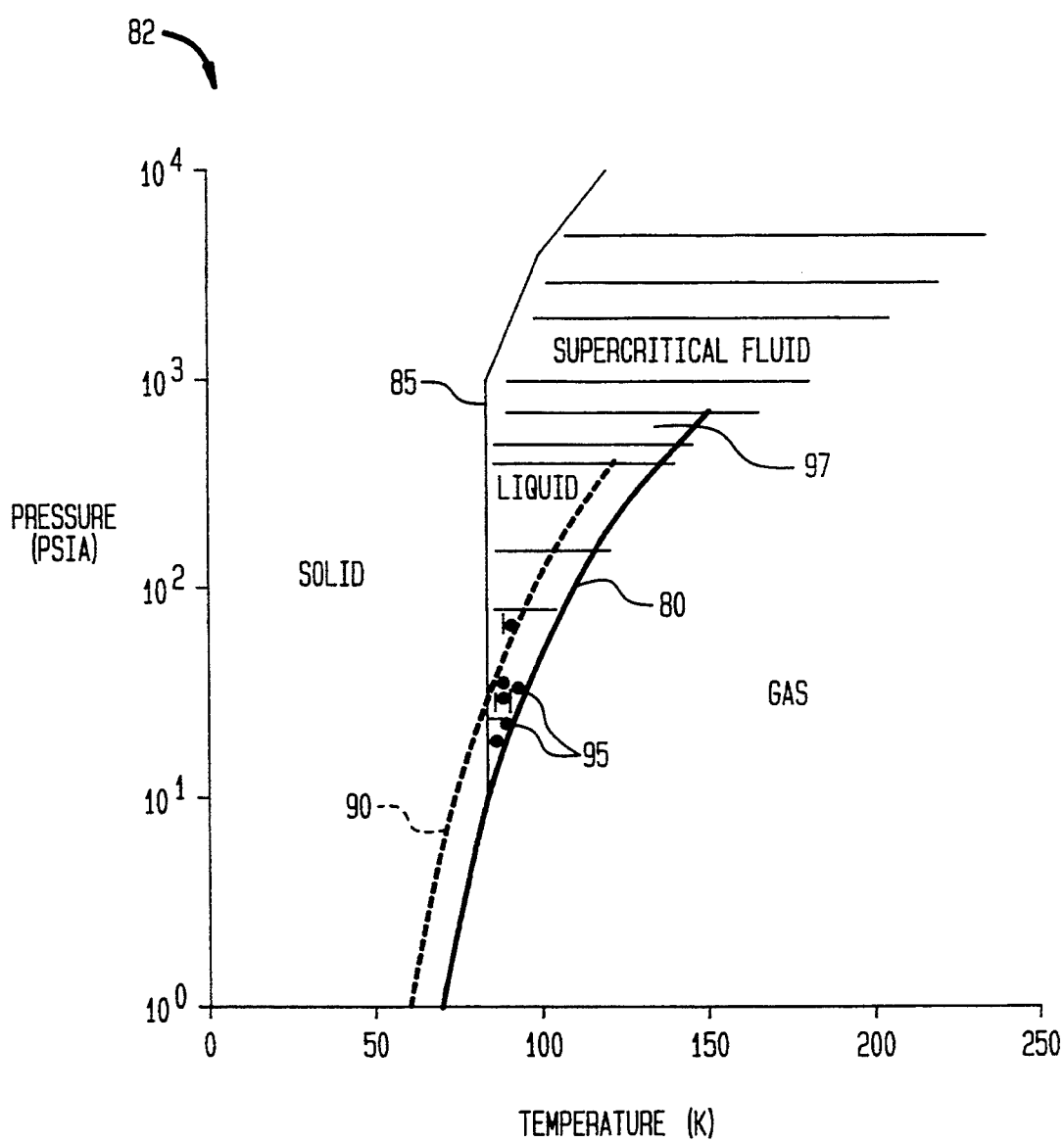
FIG. 6 is a plot of temperature vs. pressure which illustrate conditions for controlling the phases of argon.

As another specific example, argon can also be used for removing the sidewall films 20. As above, this can be achieved by expanding a vapor liquid mixture of argon so as to produce an argon cryogenic jet stream having cryogenic argon particles therein. In this regard, reference is now made to FIG. 6, which shows a plot 82 of the conditions (temperature vs. pressure) which control the phases of argon. More particularly, the solid lines 80 and 85 show the delineation between the different phases of argon, and the specific phases of argon are labelled on the plot 82. The dashed line 90 and points 95 will be explained hereinbelow. As can be seen on the plot 82, if the argon has the conditions within the shaded area 97, the argon is in vapor liquid form, and can be converted into a cryogenic argon solid particles when it is expanded into atmosphere and/or vacuum. A semiconductor structure will not be damaged when sidewall film is removed therefrom using a cryogenic jet stream produced by expanding an argon vapor liquid mixture through an orifice having a diameter of between 0.005" and 0.05" into vacuum, wherein the argon vapor liquid mixture has a pressure of between approximately 10 psia and approximately 300 psia, and a temperature of between approximately −308 F. and −225 F.

In another embodiment, the size of the cryogenic particles 55' is further altered and thus controlled by using two different material. One material is used as a diluent to reduce the saturation ratio S of the second material and act as a carrier, and the second material is the condensible species. For example, nitrogen gas can be used as a diluent, and mixed with argon gas or argon vapor liquid mixture, for producing fine particles which are as small as a few nanometers in size. The diluent should have a lower condensation temperature than the expansion temperature so that the diluent will always remains in the gas phase and function as the carrier. The diluent reduces the concentration of the condensible species, in this example argon, and thus reduces the size and/or density of the argon solid particles formed through the expansion. It has been found that the mean size of the cryogenic argon particles can be controlled in the range of 20 nm to 3 micron in diameter when the mixture ratio of argon to nitrogen ranges from 10% to 90% argon by volume.

The use of the diluent gas also serves the purpose to extend the operating ranges of the condensible material. With reference again to FIG. 5, the points 95 indicate the conditions of argon liquid which will form argon solids using nitrogen gas as the diluent. The argon alone will not condense properly since it does not possess sufficient pressure for expansion and cooling. The use of nitrogen as the carrier provides additional pressure since it stays as the gas in this range. The dashed line 90 represents the boundary of nitrogen as a gas, on the right hand side, and as a liquid or solid, on the left hand side.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

We claim:

1. A method of fabricating a semiconductor structure, comprising the steps of:
    providing a semiconductor substrate having a material disposed thereon;
    masking said material with a mask having an appropriate pattern for forming a semiconductor structure;
    etching unmasked portions of said material so as to form said semiconductor structure, wherein said etching produces a film which attaches onto said semiconductor structure and/or on said semiconductor substrate; and
    removing said film from said semiconductor structure according to the steps of
        producing a cryogenic jet stream having cryogenic particles therein; and
        directing said cryogenic jet stream at said film such that said crogenic jet stream impinges on and causes said film to decrease in temperature so that a high temperature gradient develops between said film and said semiconductor structure, said film detaching from said semiconductor structure and fracturing due to contraction caused by the decrease in temperature and high temperature gradient.

2. A method according to claim 1, wherein said cryogenic particles are carried within said cryogenic jet stream at a velocity of approximately sonic velocity.

3. A method according to claim 2, wherein the mean diameter of said cryogenic particles is less than approximately 1 micron.

4. A method according to claim 1, wherein said cryogenic jet stream is directed at an angle of between approximately 20 degrees and 90 degrees relative to said substrate.

5. A method according to claim 1, wherein said cryogenic particles impact said film with mechanical energy of below approximately 100 eV.

6. A method according to claim 1, further comprising the step of directing said detached and fractured film away from said semiconductor structure with said cryogenic jet stream.

7. A process according to claim 1, wherein said semiconductor structure comprises at least one sidewall and said film produced during said step of etching attaches onto said at least one sidewall of said semiconductor structure for passivating said at least one sidewall of said semiconductor structure for preventing undercutting of said semiconductor during said step of etching.

8. A process according to claim 7, wherein said at least one sidewall of said semiconductor structure defines a boundary of a trench, and said film produced during said step of etching attaches onto said at least one sidewall of said semiconductor structure.

9. A process according to claim 8, wherein said step of removing further includes a step of controlling size of said cryogenic particles in said cryogenic jet stream such that said cryogenic particles penetrate into said trench and contact said film attached on said at least one sidewall of said semiconductor structure which defines said trench.

10. A method according to claim 9, further comprising the step of directing said detached and fractured film away from said semiconductor structure with said cryogenic jet stream.

11. A method according to claim 1, wherein said cryogenic jet stream is produced by expanding a vapor liquid mixture through an orifice.

12. A method according to claim 11, wherein said vapor liquid mixture is mixed with a diluent gas prior to expansion, said diluent gas having a lower condensation temperature than the temperature of the expansion.

13. A method according to claim 11, wherein said vapor liquid mixture comprises nitrogen having a pressure of between approximately 11 psia and 150 psia and a temperature of between approximately −341 F. and −270 F., and said orifice has a diameter of between approximately 0.005" and 0.05".

14. A method according to claim 11, wherein said vapor liquid mixture comprises argon having a pressure of between approximately 10 psia and 300 psia and a temperature of between approximately −308 F. and −225 F., and said orifice has a diameter of between approximately 0.005" and 0.05".

15. A method according to claim 1, further comprising the step of removing said mask subsequent to said step of etching and prior to said step of removing.

16. A method according to claim 1, wherein said step of etching comprises dry etching.

17. A method according to claim 16, wherein said dry etching comprises reactive ion etching.

* * * * *